(12) United States Patent
Sullivan et al.

(10) Patent No.: US 7,525,646 B1
(45) Date of Patent: Apr. 28, 2009

(54) MULTIPLE PATTERN GENERATOR INTEGRATION WITH SINGLE POST EXPOSE BAKE STATION

(75) Inventors: Daniel Boyd Sullivan, Edina, MN (US); Brain Neal Caldwell, Milton, VT (US); Adam Charles Smith, Colchester, VT (US); Jed Hickory Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/057,345

(22) Filed: Mar. 27, 2008

(51) Int. Cl.
*G03B 27/32* (2006.01)
(52) U.S. Cl. .................... 355/77; 700/112; 700/121
(58) Field of Classification Search ............. 355/53, 355/77; 430/311; 700/112, 121
See application file for complete search history.

(56) References Cited

U.S. PATENT DOCUMENTS

| | | | |
|---|---|---|---|
| 3,946,484 | A | 3/1976 | Aronstein et al. |
| 6,418,356 | B1 | 7/2002 | Oh |
| 6,941,008 | B2 | 9/2005 | Ando et al. |
| 7,139,631 | B2 | 11/2006 | Oh |
| 7,195,407 | B2 | 3/2007 | Van Den Nieuwelaar et al. |
| 7,262,829 | B2 | 8/2007 | Hayashida et al. |
| 2007/0004052 | A1* | 1/2007 | Wada et al. .................. 438/5 |
| 2007/0077171 | A1 | 4/2007 | Hamada |
| 2007/0215040 | A1* | 9/2007 | Huang et al. .................. 118/54 |
| 2008/0143985 | A1 | 6/2008 | Van De Fransiscus et al. |
| 2008/0145791 | A1 | 6/2008 | Johannes et al. |

OTHER PUBLICATIONS

Cremer et al., SU-8 as resist material for deep X-ray lithography, 2001, Springer-Verlag, Microsystem Technologies, vol. 7, pp. 11-16.*
Van Zant, Peter, Microchip Frabrication, 2004, McGraw-Hill, 5th Edition, p. 241.*
Kaempf Ulrich, Automated Wafer Transport in the Wafer Fab, 2007, IEEE/SEMI Advanced Semiconductor Manufacturing Conference, pp. 356-361.*
Sasaki, et al.,J., Proceedings, SPIE-Int. Soc. Opt. Eng, V 4764, No. 18th, European Conference on Mask Technology for Integrated Circuits & Microcomponents, Aug. 16, 2002, p. 112-121.

* cited by examiner

*Primary Examiner*—Diane I. Lee
*Assistant Examiner*—Steven H. Whitesell-Gordon
(74) *Attorney, Agent, or Firm*—PRTSI, Inc.; Martin D. Moynihan

(57) ABSTRACT

A system and method of operation for a lithographic system having multiple exposure stations sharing one or more post-expose bake station and a centralized control system that schedules work through the expose station to the post-expose bake station while taking into consideration the patterning time for work pieces to be scheduled as well as the amount of post-expose delay allowable for the exposed work pieces.

1 Claim, 2 Drawing Sheets

MULTIPLE PATTERN GENERATOR INTEGRATION WITH SINGLE POST EXPOSE BAKE STATION

FIELD OF INVENTION

The invention is in the field of lithographic systems used in the fabrication of photomasks for production of shapes and features in semiconductor integrated circuits and in the configuration and control of such systems as well in the management and scheduling of the workflow in such systems.

BACKGROUND

One of the steps in semiconductor fabrication is that of defining shapes and features in either semiconductor substrates, in films or layers formed on substrates, or in photomasks that will be used in photolithographic processes to transfer the shapes and features onto such substrates, films, or layers.

An electron beam, also called e-beam, may be used to generate such shapes by directly writing into a photo sensitive coating in which the shape is to be transferred. Other methods or systems of transferring the shapes include optical projection e-beam, projected ion beams, and X-ray lithographic systems. The advantage of electron beam over these other systems is that the e-beam system doesn't require photomasks, provides high resolution, and provides good level to level registration capability. The disadvantage of an e-beam system is that it is basically slow and is dependent on the number, complexity, and size of the shapes to be written. For most applications, photomasks are used to ensure consistent quality and imaging fidelity. The production of these photomasks is accomplished using similar direct-write technologies, where an energized beam (generally e-beam, optical, or ion) is used to form a pattern into a photo sensitive layer applied upon the photomask substrate. This latent image is then developed into freestanding structures which are used during a pattern transfer etch to transfer the image to the underlying films, which include, but are not limited to Chrome, Chrome oxide, Molybdenum silicide, quartz, and carbon.

Prior to development of the photoresist, so called chemically-amplified resists need to be processed through a thermal cycle to complete the chemical polymerization or depolymerization that results from the exposure of the photoresist to the energized beam. After a work piece such as a semiconductor substrate, wafer, or photomask, has been exposed by the patterning tool, it is sent to another tool or station, called the post-expose bake, PEB, station, where this thermal cycling occurs, generally between 85 and 200 degrees C., for a duration of, typically, between 30 seconds and 1 hour.

Post-expose bake time at the PEB station is usually less than the direct write time of the e-beam tool, typically by an order of magnitude. Thus, while a work piece, is in an e-beam system which has a separate, dedicated PEB station attached to each of its one or more e-beam patterning tools, the PEB station, most likely, will have already finished baking the previously patterned work piece and will be sitting idle waiting for the next work piece. This leads to under utilization of the post-expose bake station.

One way to resolve this problem is to configure the lithographic system with multiple e-beam patterning tools all connected to a single PEB station, thus yielding improved tool utilization, lower costs, and potentially improved product quality.

However, chemically amplified photoresists, used, in conjunction with high current e-beam tools, generally experience a degradation in resolution proportional to the time that passes between pattern generation and post-expose bake, called post-expose delay, or PED, time. This degradation, combined with the situation that different work pieces often require different patterning times and a lack of automated means of scheduling the writing and transport of the work pieces to the PEB station, can result in a variation in PED time which, in turn, will impact the average critical dimension (CD) and the dimensional distribution of the shapes on the finished product. FIG. 1 illustrates the negative effects that longer post-expose delay times have on various feature types. Here, experimental data for three different classes of shapes, namely, line shapes, isolated shapes and nested shapes, is represented. The post-expose bake delay versus the mean to target (or offset from desired image size) for each data type is plotted. The graph in FIG. 1 clearly shows degradation in the mean to target for each data class as the post-expose bake delay time increases.

SUMMARY

This invention addresses the problems discussed above by teaching lithographic system configurations, methods of operation and control of such lithographic systems, and methods and systems for scheduling work pieces through such a lithographic patterning system so as to afford better tool utilization, throughput, cost, quality, and performance.

The system is configured as a lithographic system comprising multiple exposure stations, wherein, two or more of said multiple exposure stations each interface with a single or multiple shared post-expose bake stations, through an automated transport and post-expose bake loading system. The lithographic system further comprises a centralized control system. A method of controlling the operation of, and the workflow through, the lithographic system entails the use of the centralized control system which uses pattern data and patterning tool parameters for estimating the patterning time of each work piece to be patterned by the two or more exposure stations. Further, using the estimated patterning time related to each work piece, parameters related to the materials of each work piece, and parameters related to prior processes performed on each work piece, the centralized control system determines in which sequence the patterning of the work pieces will be initiated and how much time will elapse between each initiation.

Using parameters related to the materials and related to the prior processes for fabricating and preparing the work pieces prior to entering the system, the centralized control system is also used for determining the temperature for and setting the temperature of the post-expose bake station and for initiating pre-heating of the post-expose bake station prior to the arrival of the first and each subsequent work piece to be transported to the post-expose bake station. At the appropriate time, the centralized control system signals one or more of the two or more exposure stations to initiate the patterning of the work pieces in the determined sequence with each subsequent initiation separated from the previous by the determined elapse time between initiations. When the patterning is complete, the first work piece patterned is released to the automated transport system to be transported to and loaded into the post-expose bake system.

Another job of the centralized control system is the monitoring of the availability of the post-expose bake station and, based on said availability, releasing the next work piece to be baked from the exposure station on which the work piece was patterned onto the automated transport system if the post-expose bake station is available and holding the next work piece to be baked at the exposure station on which it was patterned if the post-expose bake station is not available and scheduling the holding and release times of each work piece at the exposure station on which it was patterned based on a calculated range of post exposure delay time for each work piece.

DETAILED DESCRIPTION OF INVENTION

Figure 1:
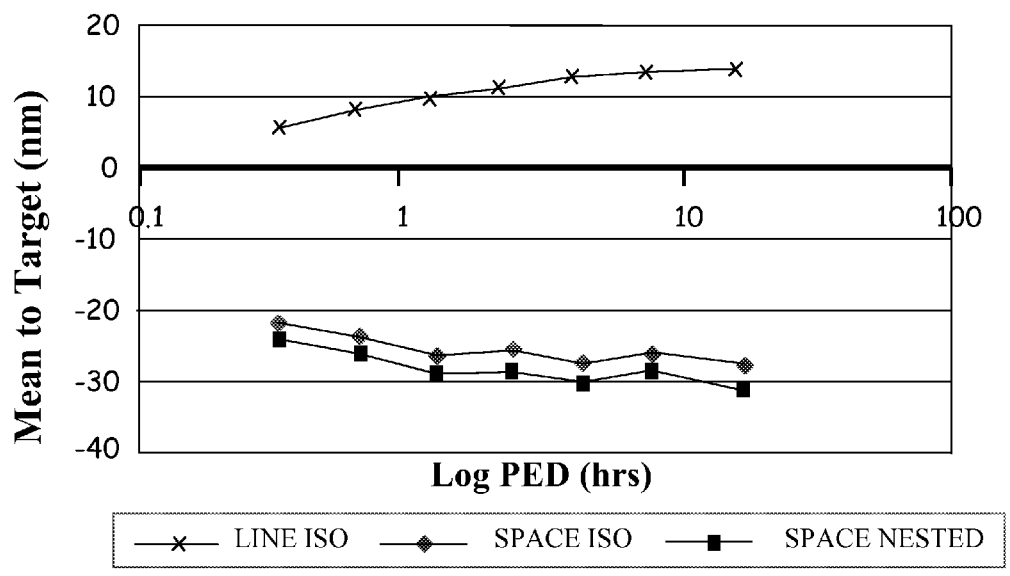
FIG. 1—A graphical representation of experimental data showing the effects of post exposure delay on the mean-to-target (offset of actual dimension to target image size) for three kinds of shapes or features (line, space or isolated, and nested).
Figure 2:
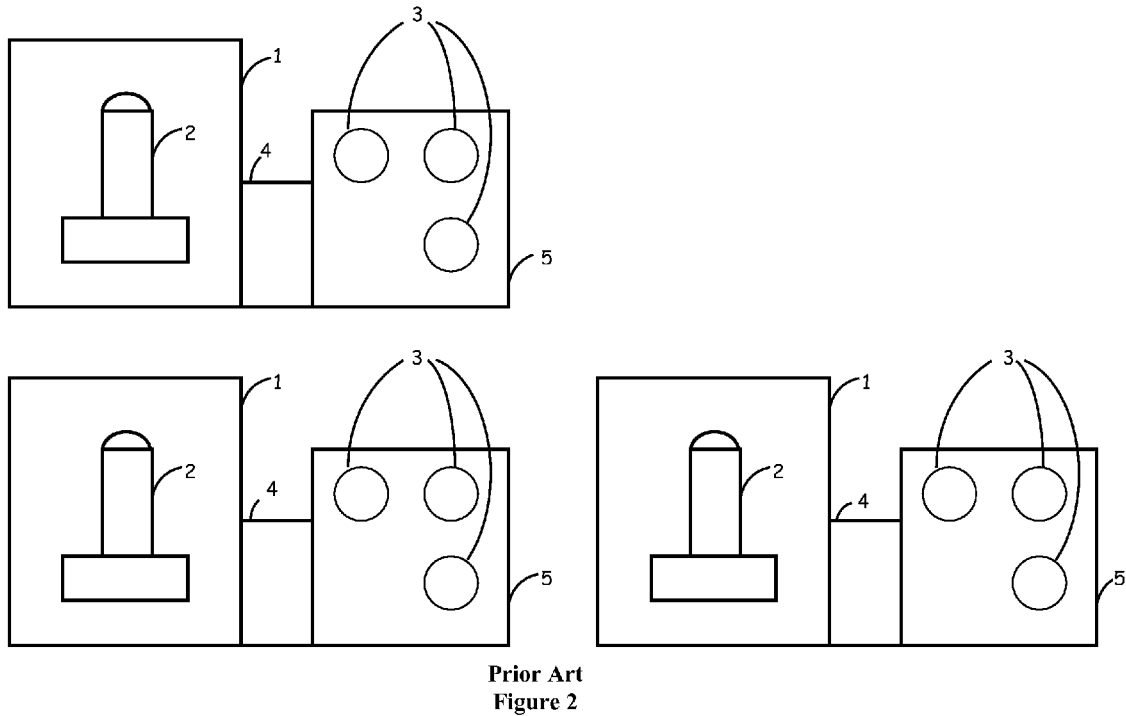
FIG. 2—Shows a lithographic system of the prior art configured with multiple exposure stations each having a dedicated post-expose bake station.

FIG. 2 depicts a lithographic system of the prior art. In this system, comprising three exposure stations 1 each further comprising a patterning tool 2, each exposure station being assigned a dedicated, separate post-expose bake station 5. Patterned work pieces are manually transported from a vacuum holding section 4 of the exposure station to its assigned post-expose bake station 5 and placed on one of three hot plates 3 contained in the post-expose bake station 5.

Figure 3:
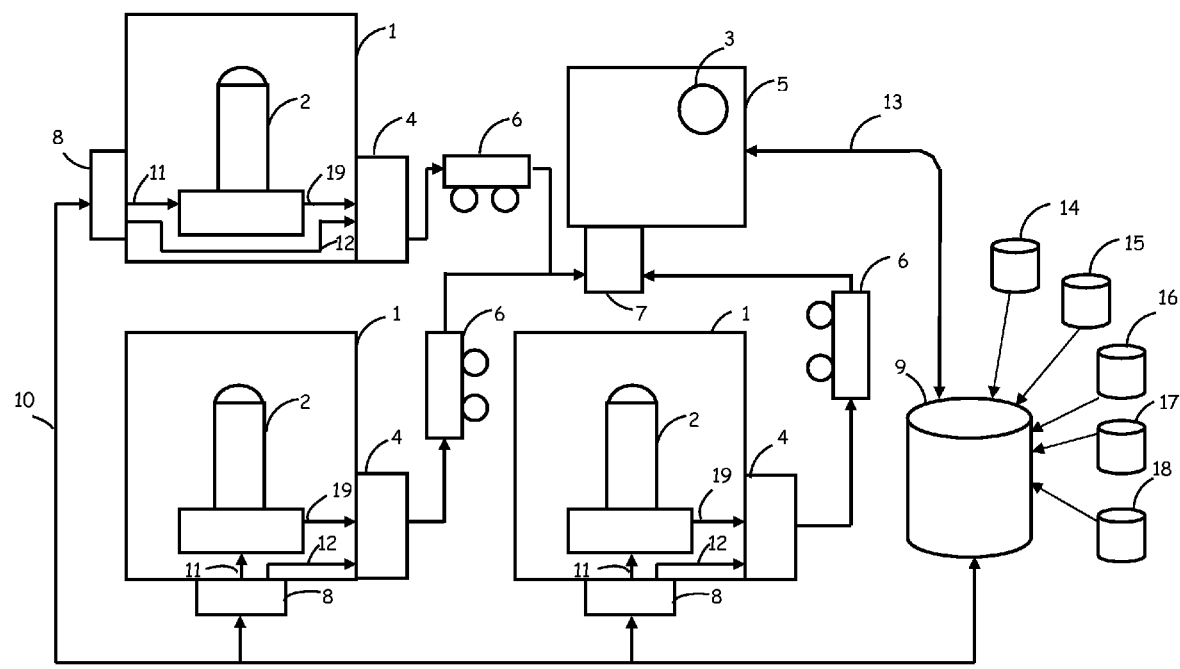
FIG. 3—Shows an exemplary embodiment of the present invention depicting a lithographic system configured with multiple exposure stations each feeding into a single, shared post-expose bake station.

In FIG. 3, an exemplary embodiment of the present invention is shown. Here, only a single, shared post exposure bake station 5, containing only a single hot plate 3 is assigned to provide the baking operation for all of the plurality of exposure stations 1. In the plurality of exposure stations 1, the patterning tools 2 pattern the work pieces which are then fed into their respective vacuum holding section 4. Each vacuum holding section 4 is connected to an automated transport system 6 at one end of the automated transport system with the other end of the automated transport system 6 connected to the loader 7 of the post-expose bake station 5.

FIG. 3 also shows a software driven control system and how it is connected to the lithographic system. One component of the control system is a control interface unit 8, with one such unit 8 interfacing with each of the plurality of exposure stations 1. Another component is the software driven centralized control center 9. The centralized control center 9 is connected to the control interface units 8 by way of a control bus 10. Control signals received by the control interface units 8 are translated or passed through to the patterning tools 2 via patterning control buses 11 and either translated or passed through to the vacuum holding sections 4 via vacuum holding control buses 12. The centralized control center 9 also interfaces with the post-expose bake station 3 via a bi-directional post-expose bake monitoring and control bus 13. In addition, the centralized control center 9 receives, as input, parameters and data from five database files, a materials database file 14, a process database file 15, a work piece pattern database file 16, a patterning tool database file 17 and a rules and targeting database file 18.

In the exemplary embodiment of FIG. 3, the operation and control of the lithographic system may be described as follows. The pattern database file 16 and the patterning tool database file 17 provide information to the centralized control center 9 related to work pieces (not shown) that are scheduled to be patterned, so that the time required to pattern each of the work pieces may be estimated. The materials database file 14, the process database file 15, and the rules and targeting database file 18 provide the centralized control center 9 with the information necessary to determine a range of post exposure bake delays that may be tolerated by each work piece. Based on the estimated time to pattern each work piece and the amount of post-expose delay to be tolerated, the sequence of order for starting the patterning of the work pieces and the time duration between the starting of the individual work pieces are determined. A first set of work pieces are loaded into the patterning tools 2 in the exposure stations 1. Control signals are then provided by the centralized control system 9, over control bus 10, to the control interface units 8 to initiate the starts in the predetermined sequence and time. Steps for post-expose bake are performed as follows. At a predetermined time before the completion of the patterning of a first work piece, the centralized control unit 9 signals, over the bi-directional post-expose bake monitoring and control bus 13, the post-expose bake station 5 to begin heating its hot plate 3 and also provides information to the post-expose bake station 5 as to what temperature to heat the hot plate 3 to. In the meantime, the centralized control center 9 is monitoring, over the bi-directional post-expose bake monitoring and control bus 13, the availability of the post-expose bake station 5. When the first work piece has been patterned by a patterning tool 2, it is sent, as shown by arrow 19, to the vacuum holding section 4 and a new work piece is loaded into that patterning tool 2. If the post-expose bake station 5 is available, the work piece is then released to the transport system 6 at a time based on the predetermined post-expose delay tolerance. If the post-expose bake station 5 is not available at the predetermined time for release from the vacuum holding section 4, the work piece is held until the centralized control center signals it is available. The above steps performed for post-expose bake of the first completed patterned work piece are repeated for each subsequently completed work piece until all work pieces have been patterned and baked.

Wherein the embodiment of FIG. 3 describes a system configuration of multiple exposure stations all interacting with a single shared post-expose bake station, any combination of exposure stations and shared or dedicated post-expose bake stations is possible. Also, a single exposure tool can interface with more than one shared or dedicated post-expose bake station.

While the control method describes scheduling the time for starting the exposure process of each work piece entering the multiple exposure tools and the advance of the work piece between the exposure tool and the single, shared post-expose bake station, the method may also entail to which post-expose bake station to advance the work piece in the case of any exposure station interfacing with more than one post-expose bake station.

Also the step involved in determining the start times and delays for individual work pieces may make this determination separately for each of a plurality of groups of work pieces of an entire set of work pieces scheduled to be patterned and baked or all at once for the entire set of work pieces scheduled to be patterned and baked.

The invention claimed is:

1. A method of controlling the operation of, and the workflow through, a lithographic system, said lithographic system comprising multiple exposure stations, each having an input and an output and each having a vacuum holding section at the output, two or more of which said multiple exposure stations each interface with a single, shared post-expose bake station, through an automated transport system and post-expose bake loading system, said method comprising the steps of:

estimating the patterning time of each work piece to be patterned by the two or more exposure stations, based on pattern data and patterning tool parameters;

determining in which sequence of order the work pieces will be presented for patterning in the two or more exposure stations and how much time will elapse between the presentation of each work piece, using the estimated patterning times, parameters related to the materials of each work piece, and parameters related to prior processes related to each work piece;

determining a temperature for the post-expose bake for each work piece and, controlling the setting of said temperature of the single, shared post-expose bake station for each work piece for initiating pre-heating of the post-expose bake station prior to the arrival of each work piece to be transported to the post-expose bake station, using the parameters related to the materials and prior processes related to each of the work pieces;

initiating the patterning of the work pieces by the two or more exposure stations in the determined sequence with each subsequent initiation separated from the previous by the determined elapse time between initiations;

releasing the first work piece patterned to the automated transport system to be transported to and loaded into the single, shared post-expose bake system;

monitoring the availability of the single, shared post-expose bake station and, based on said availability, releasing the next work piece to be baked from the exposure station on which the work piece was patterned, onto the automated transport system if the single, shared post-expose bake station is available and holding, at the vacuum holding section of the exposure station on which the work piece was patterned, the next work piece to be baked if the single, shared post-expose bake station is not available; and scheduling the holding at and release from times of individual work pieces in the vacuum holding sections of the two or more exposure stations on which the work piece was patterned based on a calculated range of post exposure delay time for each work piece and the availability of the single, shared post-expose bake station.

\* \* \* \* \*